United States Patent
Yagi et al.

(10) Patent No.: US 11,742,176 B2
(45) Date of Patent: Aug. 29, 2023

(54) TRANSMISSION ELECTRON MICROSCOPE AND METHOD OF ADJUSTING OPTICAL SYSTEM

(71) Applicant: JEOL Ltd., Tokyo (JP)

(72) Inventors: Kazuki Yagi, Tokyo (JP); Yoshiki Oyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 136 days.

(21) Appl. No.: 17/536,288

(22) Filed: Nov. 29, 2021

(65) Prior Publication Data

US 2022/0172924 A1 Jun. 2, 2022

(30) Foreign Application Priority Data

Nov. 30, 2020 (JP) .................. 2020-198710

(51) Int. Cl.
*H01J 37/28* (2006.01)
*H01J 37/10* (2006.01)
*H01J 37/26* (2006.01)
*H01J 37/147* (2006.01)

(52) U.S. Cl.
CPC .............. *H01J 37/28* (2013.01); *H01J 37/10* (2013.01); *H01J 37/147* (2013.01); *H01J 37/265* (2013.01); *H01J 2237/2802* (2013.01)

(58) Field of Classification Search
CPC .. H01J 37/00; H01J 37/02; H01J 37/26; H01J 37/28; H01J 37/10; H01J 37/147; H01J 37/265; H01J 2237/2802; H01J 2237/0492; H01J 2237/1501
USPC ......................................... 250/306, 307, 311
See application file for complete search history.

(56) References Cited

U.S. PATENT DOCUMENTS

| 4,820,921 A * | 4/1989 | Bakker ................. H01J 37/265 250/311 |
| 2002/0033451 A1* | 3/2002 | Nagaoki ................. H01J 37/26 250/311 |
| 2002/0126366 A1* | 9/2002 | Weickenmeier .... H01J 37/3174 359/280 |
| 2007/0158567 A1* | 7/2007 | Nakamura .......... H01J 37/1471 250/311 |
| 2015/0228443 A1* | 8/2015 | Morita .................. H01J 37/243 250/310 |
| 2018/0076004 A1 | 3/2018 | Hanawa et al. |

FOREIGN PATENT DOCUMENTS

WO 2016166805 A1 10/2016

* cited by examiner

*Primary Examiner* — Jason L McCormack
(74) *Attorney, Agent, or Firm* — The Webb Law Firm

(57) ABSTRACT

A transmission electron microscope includes a control unit that: determines an excitation amount of a second illumination system lens based on an excitation amount of first illumination system lens such that the second illumination system lens satisfies a first optical condition; and determines a control amount of a first deflector and a control amount of a second deflector based on the excitation amount of the second illumination system lens such that the first deflector and the second deflector satisfy a second optical condition. The first optical condition is for a convergence angle of the electron beam to be constant even if the excitation amount of the first illumination system lens has changed, and the second optical condition is for an illuminating position of the electron beam and an illuminating angle of the electron beam to be constant even if the excitation amount of the first illumination system lens has changed.

6 Claims, 13 Drawing Sheets

TRANSMISSION ELECTRON MICROSCOPE AND METHOD OF ADJUSTING OPTICAL SYSTEM

CROSS-REFERENCE TO RELATED APPLICATION

This application claims priority to Japanese Patent Application No. 2020-198710 filed Nov. 30, 2020, the disclosure of which is hereby incorporated by reference in its entirety.

BACKGROUND OF THE INVENTION

Field of the Invention

The present invention relates to a transmission electron microscope and a method of adjusting an optical system.

Description of Related Art

With a transmission electron microscope, a bright-field image and a dark-field image can be acquired. The bright-field image can be acquired by selecting a transmitted wave using an objective aperture, out of an electron diffraction pattern that is formed behind an objective lens, and forming an image of the selected transmitted wave. A dark-field image can be acquired by selecting one diffracted wave using the objective aperture, out of the electron-diffraction pattern that is formed behind the objective lens, and forming an image of the selected diffracted wave (e.g. see WO 2016/166805).

In the transmission electron microscope, an electron beam emitted from an electron gun is focused by an illumination system lens, and is emitted to a specimen, and the electron beam transmitted through the specimen forms a crossover on a back focal plane of the objective lens, transmits through the objective aperture disposed on the back focal plane, and is formed on a screen.

In the transmission electron microscope, an illuminating area of the electron beam on the specimen can be changed using the illumination system lens. However, if the illuminating area of the electron beam is changed using the illumination system lens, a convergence angle of the electron beam also changes. If the convergence angle of the electron beam changes, a position where an electron-diffraction pattern is formed also changes, and in some cases the bright-field image and the dark-field image may not be accurately acquired.

SUMMARY OF THE INVENTION

According to a first aspect of the invention, there is provided a transmission electron microscope including:

a first illumination system lens for changing an illuminating area of an electron beam;

a second illumination system lens that is disposed in a subsequent stage of the first illumination system lens;

a first deflector and a second deflector that are disposed between the first illumination system lens and the second illumination system lens;

an objective lens that is disposed in a subsequent stage of the second illumination system lens; and a control unit that controls the first illumination system lens, the second illumination system lens, the first deflector and the second deflector, the control unit performing processing of:

determining an excitation amount of the second illumination system lens based on an excitation amount of the first illumination system lens, the determined excitation amount enabling the second illumination system lens to satisfy a first optical condition; and determining a control amount of the first deflector and a control amount of the second deflector based on the determined excitation amount of the second illumination system lens, the determined control amounts enabling the first deflector and the second deflector to satisfy a second optical condition, the first optical condition is an optical condition for a convergence angle of the electron beam to be constant even if the excitation amount of the first illumination system lens has changed, and the second optical condition is an optical condition for an illuminating position of the electron beam and an illuminating angle of the electron beam to be constant even if the excitation amount of the first illumination system lens has changed.

According to a second aspect of the invention, there is provided a method of adjusting an optical system in a transmission electron microscope which includes a first illumination system lens for changing an illuminating area of an electron beam, a second illumination system lens that is disposed in a subsequent stage of the first illumination system lens, a first deflector and a second deflector that are disposed between the first illumination system lens and the second illumination system lens, and an objective lens that is disposed in a subsequent stage of the second illumination system lens, the method comprising:

setting an excitation amount of the second illumination system lens to a first excitation amount;

adjusting an illuminating position of the electron beam by using the first deflector and the second deflector in a first state in which the excitation amount of the second illumination system lens is the first excitation amount, and recording a control amount of the first deflector and a control amount of the second deflector, as first shift data;

adjusting an illuminating angle of the electron beam by using the first deflector and the second deflector in the first state, and recording the control amount of the first deflector and the control amount of the second deflector, as first tilt data;

adjusting a convergence angle of the electron beam by using the first illumination system lens in the first state, and recording the excitation amount of the first illumination system lens, as first convergence angle data;

setting the excitation amount of the second illumination system lens to a second excitation amount which is different from the first excitation amount;

adjusting an illuminating position of the electron beam by using the first deflector and the second deflector in a second state in which the excitation amount of the second illumination system lens is the second excitation amount, and recording the control amount of the first deflector and the control amount of the second deflector, as second shift data;

adjusting an illuminating angle of the electron beam by using the first deflector and the second deflector in the second state, and recording the control amount of the first deflector and the control amount of the second deflector, as second tilt data;

adjusting a convergence angle of the electron beam by using the first illumination system lens in the second state, and recording the excitation amount of the first illumination system lens, as second convergence angle data;

deriving a relational expression between the excitation amount of the second illumination system lens and the control amount of the first deflector or the control amount of the second deflector based on the first shift data and the second shift data, the derived relational expression enabling the illuminating position of the electron beam to be constant even if the excitation amount of the first illumination system lens has changed;

deriving a relational expression between the excitation amount of the second illumination system lens and the control amount of the first deflector or the control amount of the second deflector based on the first tilt data and the second tilt data, the derived relational expression enabling the illuminating angle of the electron beam to be constant even if the excitation amount of the first illumination system lens has changed; and deriving a relational expression between the excitation amount of the second illumination system lens and the excitation amount of the first illumination system lens based on the first convergence angle data and the second convergence angle data, the derived relational expression enabling the convergence angle of the electron beam to be constant even if the excitation amount of the first illumination system lens has changed.

DESCRIPTION OF THE INVENTION

Figure 1:
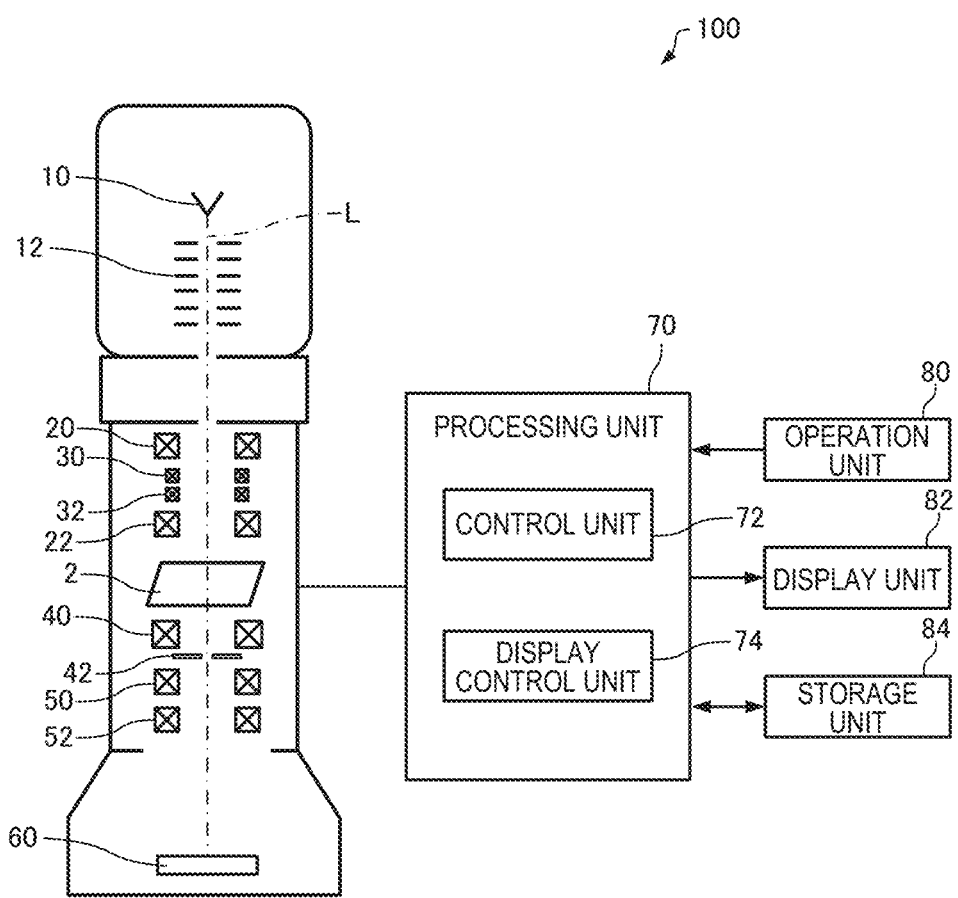
FIG. 1 is a diagram illustrating a configuration of a transmission electron microscope according to an embodiment of the invention.

According to an embodiment of the invention, there is provided a transmission electron microscope including:

a first illumination system lens for changing an illuminating area of an electron beam;

a second illumination system lens that is disposed in a subsequent stage of the first illumination system lens;

a first deflector and a second deflector that are disposed between the first illumination system lens and the second illumination system lens;

an objective lens that is disposed in a subsequent stage of the second illumination system lens; and a control unit that controls the first illumination system lens, the second illumination system lens, the first deflector and the second deflector, the control unit performing processing of:

determining an excitation amount of the second illumination system lens based on an excitation amount of the first illumination system lens, the determined excitation amount enabling the second illumination system lens to satisfy a first optical condition; and determining a control amount of the first deflector and a control amount of the second deflector based on the determined excitation amount of the second illumination system lens, the determined control amounts enabling the first deflector and the second deflector to satisfy a second optical condition;

the first optical condition is an optical condition for a convergence angle of the electron beam to be constant even if the excitation amount of the first illumination system lens has changed, and the second optical condition is an optical condition for an illuminating position of the electron beam and an illuminating angle of the electron beam to be constant even if the excitation amount of the first illumination system lens has changed.

In such a transmissions electron microscope, a convergence angle of the electron beam, an illuminating position of the electron beam, and an illuminating angle of the electron beam can be maintained to be constant by using the first illumination system lens, even if the illuminating area of the electron beam has been changed.

According to an embodiment of the invention, there is provided a method of adjusting an optical system in a transmission electron microscope which includes a first illumination system lens for changing an illuminating area of an electron beam, a second illumination system lens that is disposed in a subsequent stage of the first illumination system lens, a first deflector and a second deflector that are disposed between the first illumination system lens and the second illumination system lens, and an objective lens that is disposed in a subsequent stage of the second illumination system lens, the method comprising:

setting an excitation amount of the second illumination system lens to a first excitation amount;

adjusting an illuminating position of the electron beam by using the first deflector and the second deflector in a first state in which the excitation amount of the second illumination system lens is the first excitation amount, and recording a control amount of the first deflector and a control amount of the second deflector, as first shift data;

adjusting an illuminating angle of the electron beam by using the first deflector and the second deflector in the first state, and recording the control amount of the first deflector and the control amount of the second deflector, as first tilt data;

adjusting a convergence angle of the electron beam by using the first illumination system lens in the first state, and recording the excitation amount of the first illumination system lens, as first convergence angle data;

setting the excitation amount of the second illumination system lens to a second excitation amount which is different from the first excitation amount;

adjusting an illuminating position of the electron beam by using the first deflector and the second deflector in a second state in which the excitation amount of the second illumination system lens is the second excitation amount, and recording the control amount of the first deflector and the control amount of the second deflector, as second shift data;

adjusting an illuminating angle of the electron beam by using the first deflector and the second deflector in the second state, and recording the control amount of the first deflector and the control amount of the second deflector, as second tilt data;

adjusting a convergence angle of the electron beam by using the first illumination system lens in the second state, and recording the excitation amount of the first illumination system lens, as second convergence angle data;

deriving a relational expression between the excitation amount of the second illumination system lens and the control amount of the first deflector or the control amount of the second deflector based on the first shift data and the second shift data, the derived relational expression enabling the illuminating position of the electron beam to be constant even if the excitation amount of the first illumination system lens has changed;

deriving a relational expression between the excitation amount of the second illumination system lens and the control amount of the first deflector or the control amount of the second deflector based on the first tilt data and the second tilt data, the derived relational expression enabling the illuminating angle of the electron beam to be constant even if the excitation amount of the first illumination system lens has changed; and deriving a relational expression between the excitation amount of the second illumination system lens and the excitation amount of the first illumination system lens based on the first convergence angle data and the second convergence angle data, the derived relational expression enabling convergence angle of the electron beam to be constant even if the excitation amount of the first illumination lens has change.

This method of adjusting an optical system can derive a relational expression between the excitation amount of the first illumination system lens and the excitation amount of the second illumination system lens, and a relational expression between the excitation amount of the second illumination system lens and the control amounts of the first deflector and the second deflector, and the derived relational expressions enable the convergence angle of the electron beam, the illuminating position of the electron beam, and the illuminating angle of the electron beam to be constant even if the illuminating area of the electron beam has been changed.

Preferred embodiments of the invention will now be described in detail with reference to the drawings. It is noted that the following embodiments described below do not unduly limit the scope of the invention as stated in the claims. Further, all of the components described in the following embodiments are not necessarily essential requirements of the invention.

1. Electron Microscope

First a transmission electron microscope, which is an embodiment of the invention, will be described with reference to the drawings. FIG. 1 is a diagram illustrating a configuration of a transmission electron microscope 100 according to an embodiment of the invention.

As illustrated in FIG. 1, the transmission electron microscope 100 includes an electron source 10, a first illumination system lens 20, a second illumination system lens 22, a first deflector 30, a second deflector 32, an objective lens 40, an objective aperture 42, an intermediate lens 50, a projection lens 52, an imaging device 60, a processing unit 70, an operation unit 80, a display unit 82 and a storage unit 84.

The electron source 10 emits an electron beam. The electron source 10 is an electron gun which accelerates electrons, emitted from a cathode, by an anode, and emits an electron beam. The electron beam emitted from the electron source 10 is accelerated by an acceleration tube 12.

The first illumination system lens 20 is disposed in a subsequent stage of the electron source 10. In other words, the first illumination system lens 20 is located on the downstream side of the electron source 10. The second illumination system lens 22 is disposed in a subsequent stage of the first illumination system lens 20. The electron beam is focused and emitted to a specimen 2 through the first illumination system lens 20 and the second illumination system lens 22.

The first illumination system lens 20 is used to change the illuminating area of the electron beam on the specimen 2. By changing the excitation amount of the first illumination system lens 20, the illuminating area of the electron beam can be adjusted.

The second illumination system lens 22 is used to change the convergence angle of the electron beam emitted to the specimen 2. By controlling the excitation amount of the second illumination system lens 22, the convergence angle of the electron beam can be adjusted. In the transmission electron microscope 100, six preset values are set in advance for the excitation amount of the second illumination system lens 22. In other words, six convergence angles can be selected in the transmission electron microscope 100. A number of preset values, however, is not limited to six, but may be set to an arbitrary number.

The first deflector 30 and the second deflector 32 are disposed between the first illumination system lens 20 and the second illumination system lens 22. In the case of the illustrated example, the first deflector 30 is disposed in a subsequent stage of the first illumination system lens 20, and the second deflector 32 is dispose in a subsequent stage of the first deflector 30. The first deflector 30 and the second deflector 32 are deflecting coils that generate magnetic fields and deflect the electron beam, for example. The first deflector 30 and the second deflector 32 may be electrostatic deflectors which generate an electrostatic field and deflect the electron beam.

The transmission electron microscope 100 includes a specimen stage (not illustrated). The specimen stage holds a specimen 2.

The objective lens 40 is disposed in a subsequent stage of the second illumination system lens 22. The objective lens 40 is a lens on the first stage to form a transmission electron microscopic image (TEM image) with an electron beam.

The objective aperture 42 is disposed in a subsequent stage of the objective lens 40. The objective aperture 42 is disposed behind the objective lens 40.

The intermediate lens 50 is disposed in a subsequent stage of the objective lens 40. The projection lens 52 is disposed in a subsequent stage of the intermediate lens 50. A post-magnetic field of the objective lens 40, the intermediate lens 50 and the projection lens 52 constitute an imaging system for forming a TEM image with the electron beam transmitted through the specimen 2.

The transmission electron microscope 100 includes an optical system constituted of: the first illumination system lens 20, the first deflector 30, the second deflector 32, the second illumination system lens 22, the objective lens 40, the objective aperture 42, the intermediate lens 50 and the projection lens 52. The first illumination system lens 20, the first deflector 30, the second deflector 32, the second illumination system lens 22, the objective lens 40, the objective aperture 42, the intermediate lens 50 and the projection lens 52 are disposed in this sequence along the optical axis L of the optical system.

The imaging device 60 captures an image formed by the imaging system. The imaging device 60 is a digital camera, for example, such as a charge coupled device (CCD) camera and a complementary metal oxide semiconductor (CMOS) camera.

The operation unit 80 is for the user to input operation information, and outputs the inputted operation information to the processing unit 70. The function of the operation unit 80 can be implemented by such an input device as a keyboard, a mouse, buttons, a touch panel and a touch pad.

The display unit 82 displays an image generated by the processing unit 70. The function of the display unit 82 can be implemented by a liquid crystal display (LCD), a touch panel that also functions as the operation unit 80, and the like.

The storage unit 84 stores programs and various data for a computer to function as each composing element of the processing unit 70. The storage unit 84 also functions as a work area of the processing unit 70. The function of the storage unit 84 can be implemented by a random access memory (RAM), a read only memory (ROM), a hard disk, or the like.

The function of the processing unit 70 (computer) can be implemented by hardware, including various processors (e.g. central processing unit (CPU)), executing programs. The processing unit 70 includes a control unit 72 and a display control unit 74.

The control unit 72 controls each composing element constituting the transmission electron microscope 100. For example, the control unit 72 controls the optical system of the transmission electron microscope 100. The control unit 72 also controls the imaging device 60.

The display control unit 74 performs processing to display an image, which was generated by the processing unit 70, on the display unit 82. For example, the display control unit 74 receives information on the excitation amount of the first illumination system lens 20, and causes the display unit 82 to display information on the illuminating area of the electron beam depending on the excitation amount of the first illumination system lens 20.

In the transmission electron microscope 100, the electron beam emitted from the electron source 10 is focused by the first illumination system lens 20 and the second illumination system lens 22, is deflected by the first deflector 30 and the second deflector 32, and is emitted to the specimen 2. The imaging system constituted of the objective lens 40, the intermediate lens 50 and the projection lens 52 forms a transmission electron microscopic image (TEM image) with the electron beam transmitted through the specimen 2. The TEM image is captured by the imaging device 60.

Here, the electron beam that passed through the specimen 2 forms a crossover on a back focal plane of the objective lens 40, and passes though the objective aperture 42 disposed behind the objective lens 40. At this time, a bright-field image can be acquired by selecting a transmitted wave using the objective aperture 42, out of the electron-diffraction pattern formed behind the objective lens 40. Further, a dark-field image can be acquired by selecting one diffracted wave using the objective aperture 42, out of the electron-diffraction pattern formed behind the objective lens 40, and forming an image thereby.

In the transmission electron microscope 100, the illuminating area of the electron beam emitted to the specimen 2 can be adjusted by controlling the excitation amount of the first illumination system lens 20.

2. Operation

An operation of the transmission electron microscope 100 will be described next. In the transmission electron microscope 100, the convergence angle of the electron beam, the illuminating position of the electron beam and the illuminating angle of the electron beam can be maintained to be constant, even if the illuminating area of the electron beam is changed. The operation of the transmission electron microscope 100, when the illuminating area of the electron beam is changed, will now be described.

Figure 2:
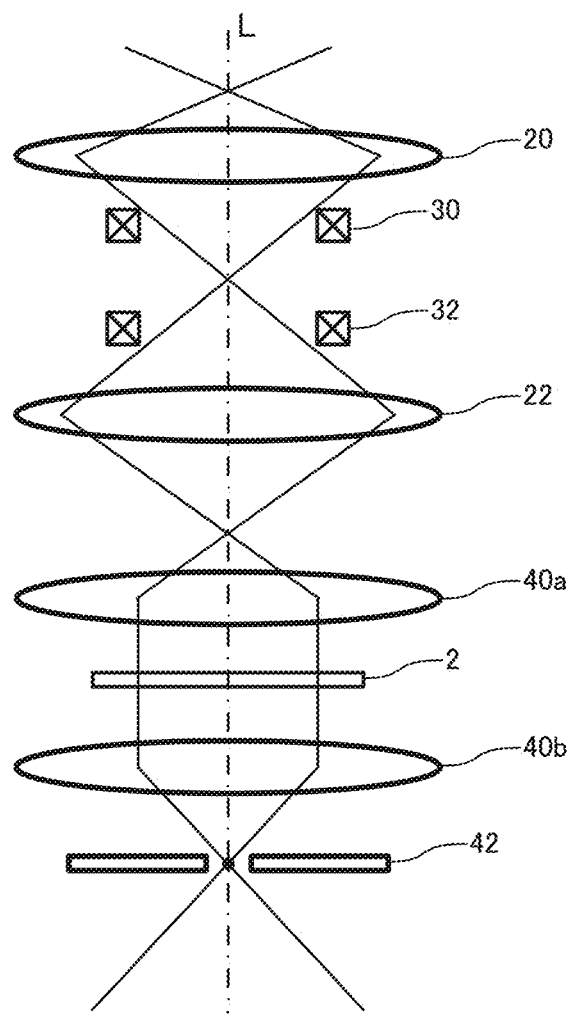
FIG. 2 is a ray diagram when a bright-field image is acquired.
Figure 3:
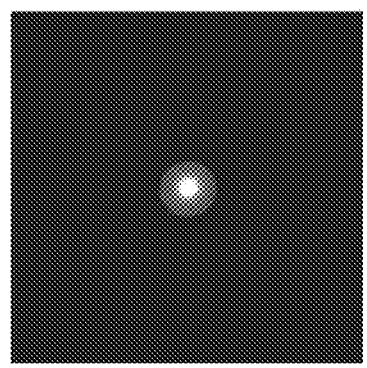
FIG. 3 is an image of a transmitted wave passed through an objective aperture, acquired in the state of the optical system illustrated in FIG. 2.
Figure 4:
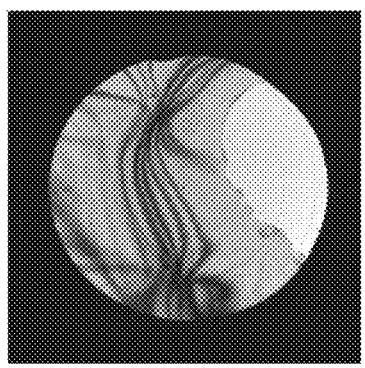
FIG. 4 is a bright-field image acquired in the state of the optical system illustrate in FIG. 2.

FIG. 2 is a ray diagram when a brighter-field image is acquired. FIG. 3 is an image of a transmitted wave passed through the objective aperture 42, acquired in the state of the optical system illustrated in FIG. 2, and FIG. 4 is a bright-field image acquired in the state of the optical system illustrated in FIG. 2.

The objective lens 40 forms a pre-magnetic field 40*a* ahead of the specimen 2, that is, on the upstream side of the specimen 2, and forms a post-magnetic field 40*b* behind the specimen 2, that is, on the downstream side of the specimen 2.

In the optical system illustrated in FIG. 2, a crossover is formed at a position of the objective aperture 42. A bright-field image can be acquired as illustrated in FIG. 4 by selecting the transmitted wave using the objective aperture 42, out of the electron-diffraction pattern formed behind the objective lens 40, as illustrated in FIGS. 2 and 3.

Figure 5:
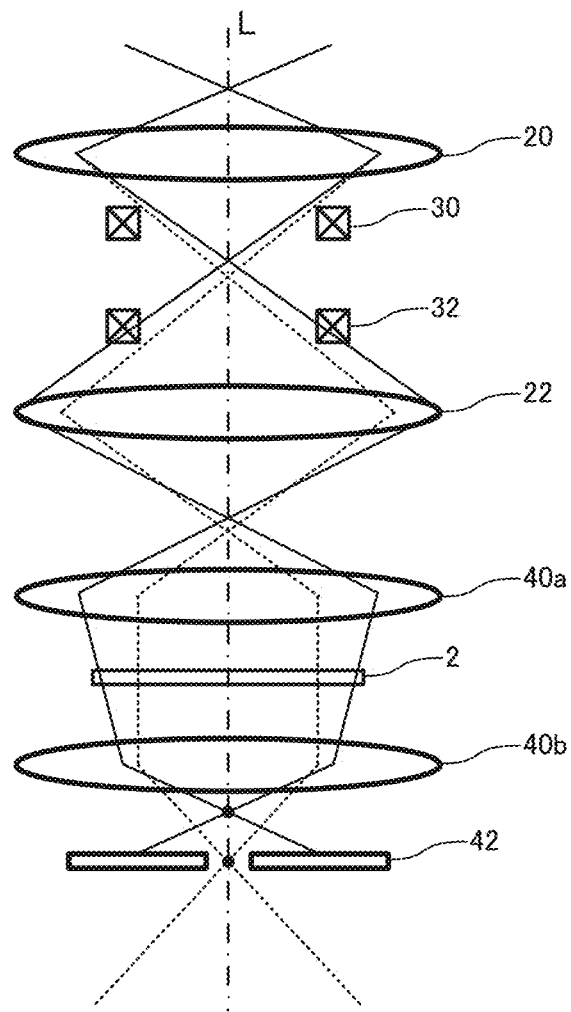
FIG. 5 is a ray diagram in a case where an excitation amount of the first illumination system lens has been increased from the state of the optical system illustrated in FIG. 2.
Figure 6:
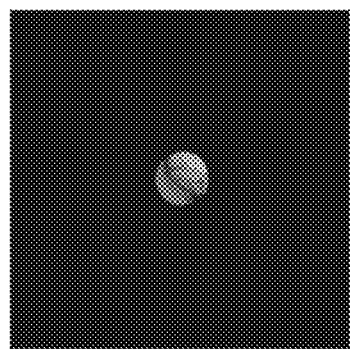
FIG. 6 is an image of a transmitted wave passed through an objective aperture, acquired in the state of the optical system illustrated in FIG. 5.
Figure 7:
FIG. 7 is a bright-field image acquired in the state of the optical system illustrated in FIG. 5.

FIG. 5 is a ray diagram in a case where the excitation amount of the first illumination system lens 20 has been increased from the state of the optical system illustrated in FIG. 2. FIG. 6 is an image of a transmitted wave passed through the objective aperture 42, acquired in the state of the optical system illustrated in FIG. 5, and FIG. 7 is a bright-field image acquired in the state of the optical system illustrated in FIG. 5.

As illustrated in FIG. 5, if the excitation amount of the first illumination system lens 20 is increased to change the illuminating area of the electron beam, the convergence angle of the electron beam changes, and the position of the crossover of the electron beam moves along the optical axis L. In other words, in the optical system illustrated in FIG. 5, the crossover is not formed at the position of the objective aperture 42. Hence, as illustrated in FIG. 6, the transmitted wave spreads, and, as illustrated in FIG. 7, the field of view of the bright-field image is restricted, and as a result, the image is seen in the shadow of the objective aperture 42. Thus in the optical system illustrated in FIG. 5, good bright-field images cannot be acquired.

In the transmission electron microscope 100, by changing the excitation amount of the second illumination system lens 22 depending on the change in the excitation amount of the first illumination system lens 20, the convergence angle of the electron beam can be maintained to be constant, even if the illuminating area of the electron beam is changed.

Figure 8:
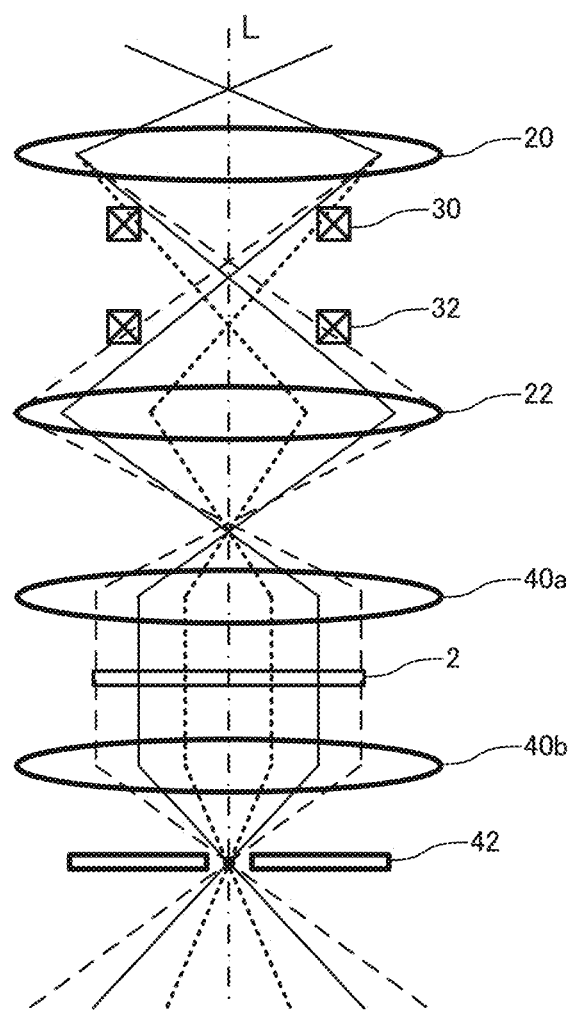
FIG. 8 is a ray diagram when an excitation amount of the second illumination system lens has been changed depending on the change in the excitation amount of the first illumination system lens.
Figure 9:
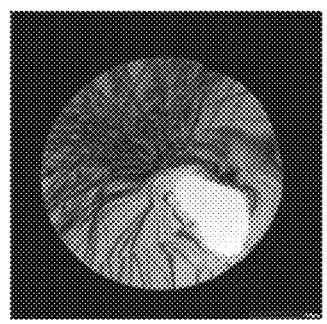
FIG. 9 is a bright-field image acquired by changing the excitation amount of the second illumination system lens depending on the change in the excitation amount of the first illumination system lens.
Figure 10:
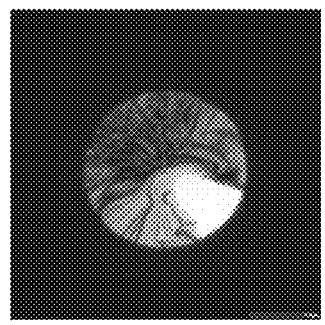
FIG. 10 is a bright-field image acquired by changing the excitation amount of the second illumination system lens depending on the change in the excitation amount of the first illumination system lens.
Figure 11:
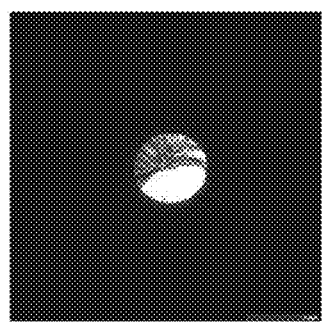
FIG. 11 is a bright-field image acquired by changing the excitation amount of the second illumination system lens depending on the change in the excitation amount of the first illumination system lens.

FIG. 8 is a ray diagram when the excitation amount of the second illumination system lens 22 has been changed depending on the change in the excitation amount of the first illumination system lens 20. FIG. 9 to FIG. 11 are bright-field images acquired by changing the excitation amount of the second illumination system lens 22 depending on the change in the excitation amount of the first illumination system lens 20.

As illustrated in FIG. 8, by changing the excitation amount of the second illumination system lens 22 depending on the change in the excitation amount of the first illumination system lens 20, the convergence angle of the electron beam can be constant, and the position of the crossover does not change, even if the illuminating area of the electron beam changes. Hence, as illustrated in FIG. 9 to FIG. 11, good bright-field images can be acquired even if the illuminating area of the electron beam is changed.

3. Processing 3.1. Processing Flow

Figure 12:
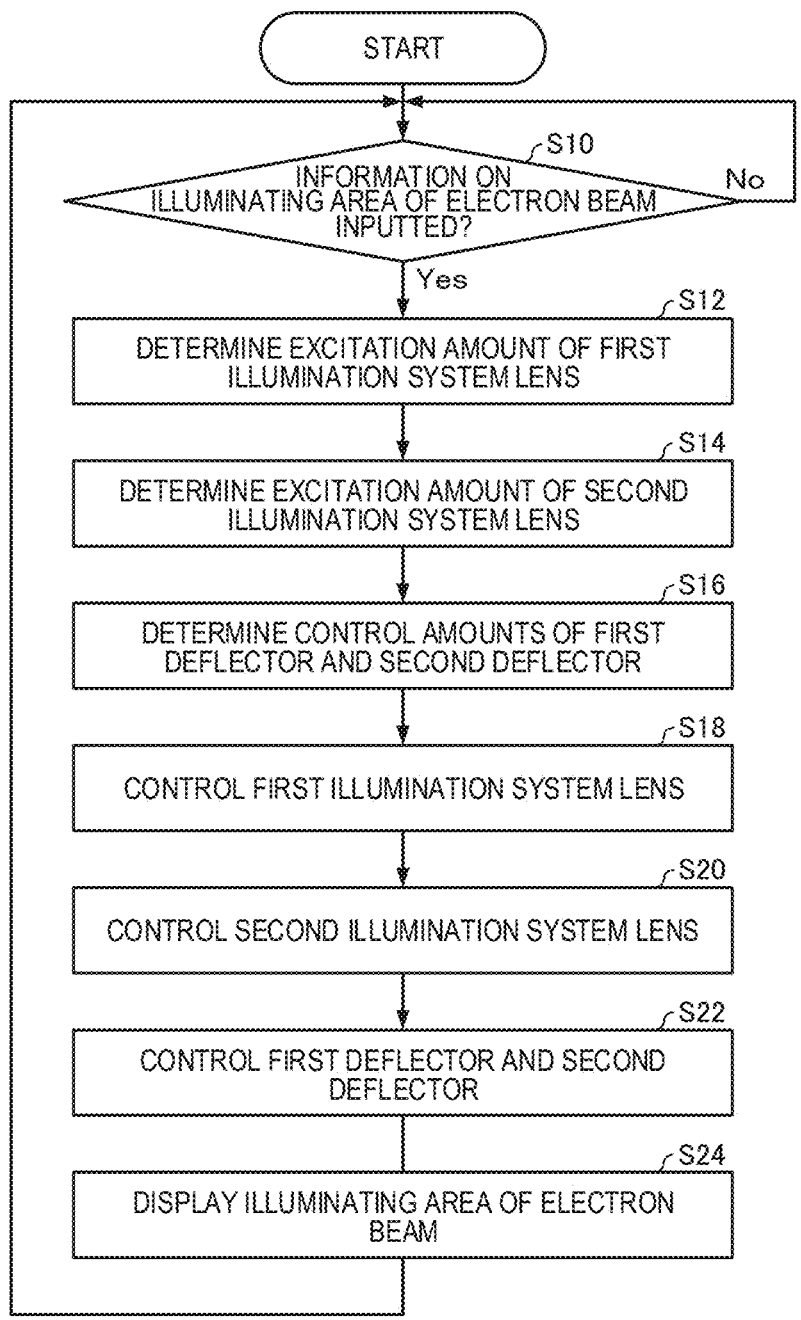
FIG. 12 is a flow chat illustrating an example of processing performed by the processing unit of the transmission electron microscope according to an embodiment of the invention.

FIG. 12 is a flow chart illustrating an example of processing performed by the processing unit 70 of the transmission electron microscope 100.

When the information on the illuminating area of the electron beam is inputted to the control unit 72 via the operation unit 80 (Yes in S10), the control unit 72 determines the excitation amount of the first illumination system lens 20 based on the information on this illuminating area (S12).

Then based on the excitation amount of the first illumination system lens 20, the control unit 72 determines the excitation amount of the second illumination system lens 22, so that the second illumination system lens 22 satisfies a first optical condition (S14).

The first optical condition here is an optical condition by which the convergence angle of the electron beam becomes constant, and the crossover of the electron beam is formed at the position of the objective aperture 42, even if the excitation amount of the first illumination system lens 20 changes. The excitation amount of the second illumination system lens 22 is determined using a relational expression between the excitation amount of the first illumination system lens 20 and the excitation amount of the second illumination system lens 22 stored in the storage unit 84 in advance. This relational expression will be described later in "3.2.1. Relational Expression Used in Processing Step S14".

Then based on the excitation amount of the second illumination system lens 22 determined in processing step S14, the control unit 72 determines a control amount of the first deflector 30 and a control amount of the second deflector 32, so that the first deflector 30 and the second deflector 32 satisfy a second optical condition (S16).

The second optical condition here is an optical condition by which the illuminating position of the electron beam and the illuminating angle of the electron beam become constant, even if the excitation amount of the first illumination system lens 20 and the excitation amount of the second illumination system lens 22 change. The control amount of the first illumination system lens 20 and the control amount of the second illumination system lens 22 are determined using a relational expression between the excitation amount of the second illumination system lens 22 and the control amounts of the first deflector 30 and the second deflector 32, stored in the storage unit 84 in advance. This relational expression will be described later in "3.2.2. Relational Expressions Used in Processing Step S16". The control amount of the first deflector 30 may be the excitation amount in the case where the first deflector 30 is a deflection coil. The same is true for the control amount of the second deflector 32.

Then the control unit 72 controls the first illumination system lens 20, so as to be the excitation amount determined in the processing step S12 (S18). Then the control unit 72 controls the second illumination system lens 22, so as to be the excitation amount determined in the processing step S14 (S20). Then the control unit 72 controls the first deflector 30 and the second deflector 32, so as to be the control amounts determined in the processing step S16 (S22).

For example, in the processing step S18, the control unit 72 sends a control signal, which includes the information on the excitation amount determined in the processing step S12, to a drive circuit (not illustrated) to control the first illumination system lens 20. Then, based on the control signal, the drive circuit supplies the excitation current to the first illumination system lens 20, whereby the first illumination system lens 20 operates. The processing step S20 and the processing step S22 are executed in the same manner.

Then, based on the excitation amount of the first illumination system lens 20, the display control unit 74 causes the display unit 82 to display the information on the illuminating area of the electron beam depending on this excitation amount (S24).

By the control unit 72 performing the above processing steps, the transmission electron microscope 100 can control the convergence angle of the electron beam, the illuminating position of the electron beam and the illuminating angle of the electron beam to be constant, even if the illuminating area of the electron beam is changed.

3.2. Relational Expressions 3.2.1. Relational Expression Used in Processing Step S14

In the processing step S14, the excitation amount of the second illumination system lens 22 is determined from the excitation amount of the first illumination system lens 20 using the relational expression between the excitation amount of the first illumination system lens 20 and the excitation amount of the second illumination system lens 22.

Figure 13:
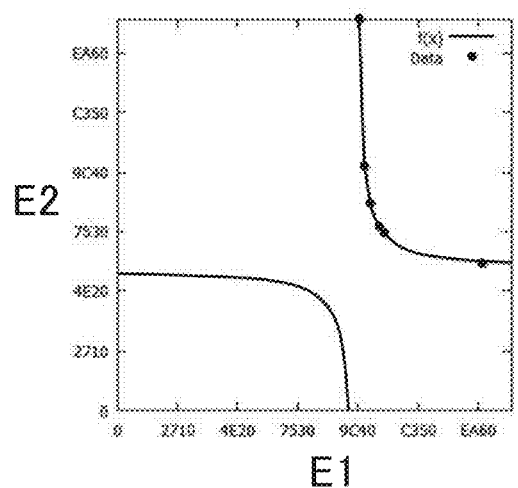
FIG. 13 illustrates a graph representing a relational expression between the excitation amount of the first illumination system lens and the excitation amount of the second illumination system lens.

FIG. 13 illustrates a graph of the relational expression between the excitation amount E1 of the first illumination system lens 20 and the excitation amount E2 of the second illumination system lens 22. The horizontal axis of the graph in FIG. 13 indicates a magnitude of the voltage or current that is applied to the first illumination system lens 20 corresponding to the excitation amount E1. The vertical axis of the graph in FIG. 13 also indicates the same.

The relational expression between the excitation amount E1 and the excitation amount E2 is expressed by an inverse proportional function, for example. By using the relational expression in FIG. 13, the excitation amount E2 can be determined from the excitation amount E1.

3.2.2. Relational Expressions Used in Processing Step S16

In the processing step S16, the relational expressions of the excitation amount E2 of the second illumination system lens 22 and the control amounts of the first deflector 30 and the second deflector 32, which are used, are: a relational expression between the excitation amount E2 and a beam shift X; a relational expression between the excitation amount E2 and a beam shift Y; a relational expression between the excitation amount E2 and a beam tilt X; a relational expression between the excitation amount E2 and a beam tilt Y; a relational expression between the excitation amount E2 and a tilt compensator X; a relational expression between the excitation amount E2 and a tilt compensator Y; a relational expression between the excitation amount E2 and a shift compensator X; and a relational expression between the excitation amount E2 and a shift compensator Y. In other words, in the processing step S16, the control amount of the first deflector 30 and the control amount of the second deflector 32 are determined from the excitation amount E2 of the second illumination system lens 22 using these eight relational expression.

(1) Relational Expressions of Excitation Amount E2 and Beam Shift

Figure 14:
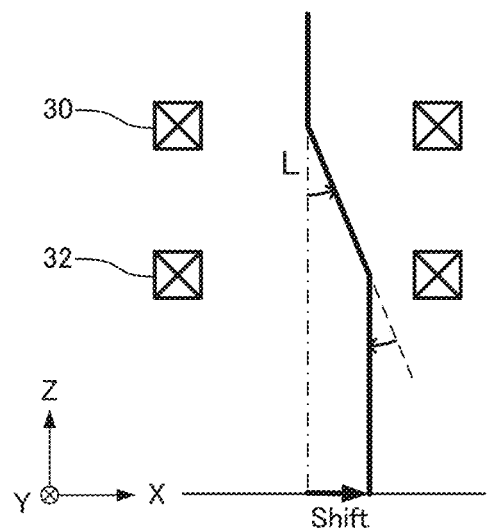
FIG. 14 is a diagram for explaining a beam shift.

FIG. 14 is a diagram for explaining a beam shift. In FIG. 14, three axes that intersect orthogonally with each other (X axis, Y axis, Z axis) are indicted. The Z axis is an axis that is parallel with the optical axis L.

As illustrated in FIG. 14, the electron beam can be shifted by using the first deflector 30 and the second deflector 32, whereby the illuminating position of the electron beam on the specimen 2 can be adjusted.

Figure 15:
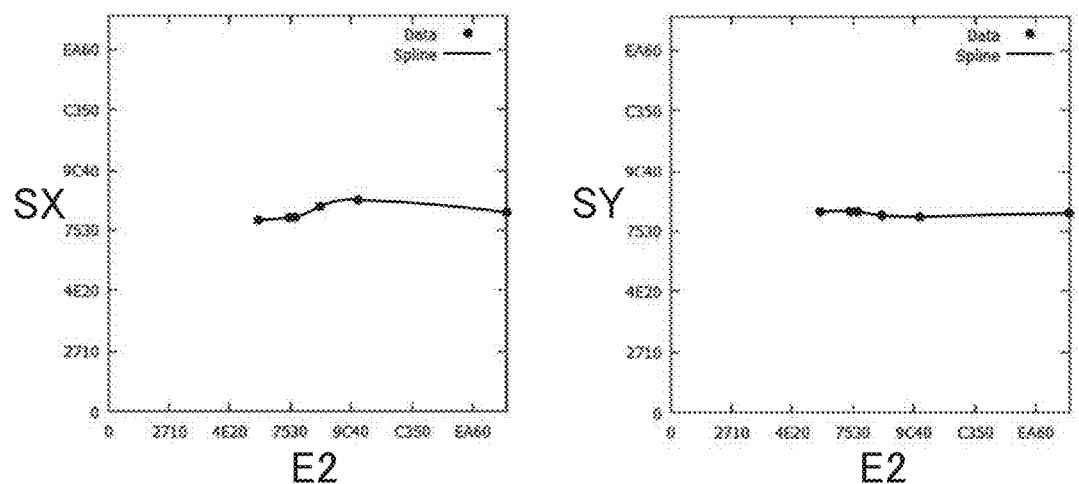
FIG. 15 illustrates graphs representing a relational expression between the excitation amount of the second illumination system lens and the beam shift.

FIG. 15 illustrates a graph of the relational expression between the excitation amount E2 of the second illumination system lens 22 and the beam shift X(SX), and a graph of the relational expression between the excitation amount E2 of the second illumination system lens 22 and the beam shift Y(SY).

The beam shift X(SX) is a parameter to control the illuminating position of the electron beam in the X direction, and the beam shift Y(SY) is a parameter to control the illuminating position of the electron beam in the Y direction.

Specifically, the beam shift X(SX) is a control amount of the first deflector 30 (or the second deflector 32) with which the illuminating position of the electron beam in the X direction becomes constant, even if the excitation amount of the second illumination system lens 22 is changed. The beam shift Y(SY) is a control amount of the first deflector 30 (or the second deflector 32) with which the illuminating position of the electron beam in the Y direction becomes constant, even if the excitation amount of the second illumination system lens 22 is changed.

In the transmission electron microscope 100, the beam shift is adjusted either by: interlocking the second deflector 32 to the first deflector 30 using the first deflector 30 as the reference; or interlocking the first deflector 30 to the second deflector 32 using the second deflector 32 as the reference. The beam shift X and the beam shift Y illustrated in FIG. 15 are control amounts of the deflector which is operated as the reference. In FIG. 15, the beam shift X and the beam shift Y are the magnitudes of the voltages or currents that are applied to the deflector corresponding to the control amount of the deflector.

The relational expression between the excitation amount E2 and the beam shift X(SX) and the relational expression between the excitation amount E2 and the beam shift Y(SY) are expressed using spline functions, for example. Here, the two relational expressions illustrated in FIG. 15 are expressed by the spline functions, but these relational expressions are not limited to spline functions.

(2) Relational Expressions of Excitation Amount E2 and Beam Tilt

Figure 16:
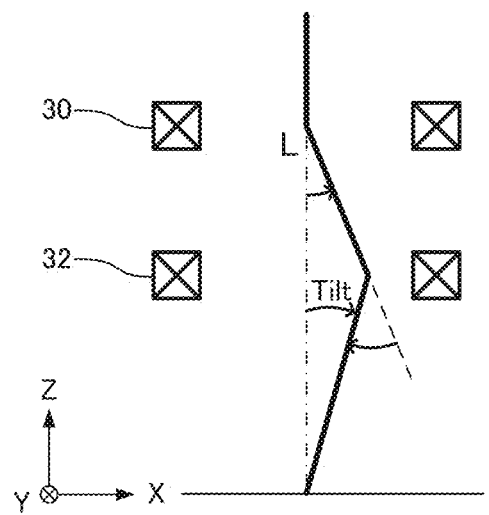
FIG. 16 is a diagram for explaining a beam tilt.

FIG. 16 is a diagram for describing a beam tilt. A beam tilt is a parameter to control the illuminating angle of the electron beam emitted to the specimen 2.

As illustrated in FIG. 16, the illuminating angle (Tilt) of the electron beam can be adjusted by using the first deflector 30 and the second deflector 32. The illuminating angle of the electron beam is an inclination of the electron beam with respect to the optical axis L.

Figure 17:
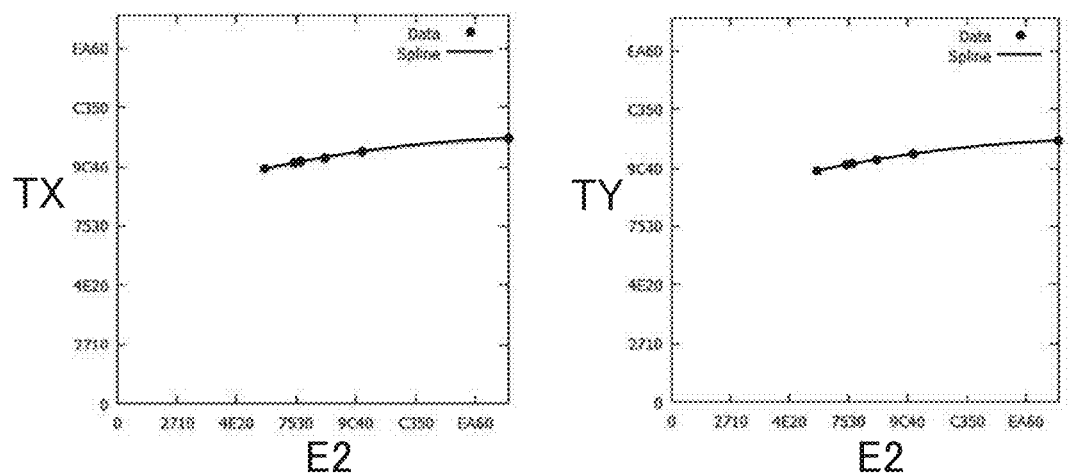
FIG. 17 illustrates graphs representing a relational expression between the excitation amount of the second illumination system lens and the beam tilt.

FIG. 17 illustrates a graph of the relational expression between the excitation amount E2 of the second illumination system lens 22 and the beam tilt X(TX), and a graph of the relational expression between the excitation amount E2 of the second illumination system lens 22 and the beam tilt Y(TY).

The beam tilt X(TX) is a parameter to control the illuminating angle of the electron beam in the X direction, and the beam tilt Y(TY) is a parameter to control the illuminating angle of the electron beam in the Y direction.

Specifically, the beam tilt X(TX) is a control amount of the second deflector 32 with which the illuminating angle of the electron beam in the X direction becomes constant, even if the excitation amount of the second illumination system lens 22 is changed. The beam tilt Y(TY) is a control amount of the second deflector 32 with which the illuminating angle of the electron beam in the Y direction becomes constant, even if the excitation amount of the second illumination system lens 22 is changed.

In the transmission electron microscope 100, the beam tilt is adjusted by interlocking the first deflector 30 to the second deflector 32 using the second deflector 32 as the reference. The beam tilt X(TX) and the beam tilt Y(TY), illustrated in FIG. 17, are control amounts of the second deflector 32 which is operated as the reference. In FIG. 17, the beam tilt X(TX) and the beam tilt Y(TY) are magnitudes of the voltage or current that is applied to the second deflector 32 corresponding to the control amount of the second deflector 32.

The relational expression between the excitation amount E2 and the beam tilt X(TX) and the relational expression between the excitation amount E2 and the beam tilt Y(TY) are expressed using the spline functions, for example. Here, the two relational expressions illustrated in FIG. 17 are expressed by the spline functions, but the two relational expressions are not limited to the spline functions.

(3) Relational Expressions of Excitation Amount E2 and Tilt Compensator

When the illuminating angle of the electron beam is changed, the electron beam must be tilted so that the illuminating position of the electron beam does not change. Therefore in the transmission electron microscope 100, the first deflector 30 and the second deflector 32 are interlocked. The interlocking ratio of the first deflector 30 and the second deflector 32 at this time is called. "tilt compensator" (tilt interlocking ratio).

Figure 18:
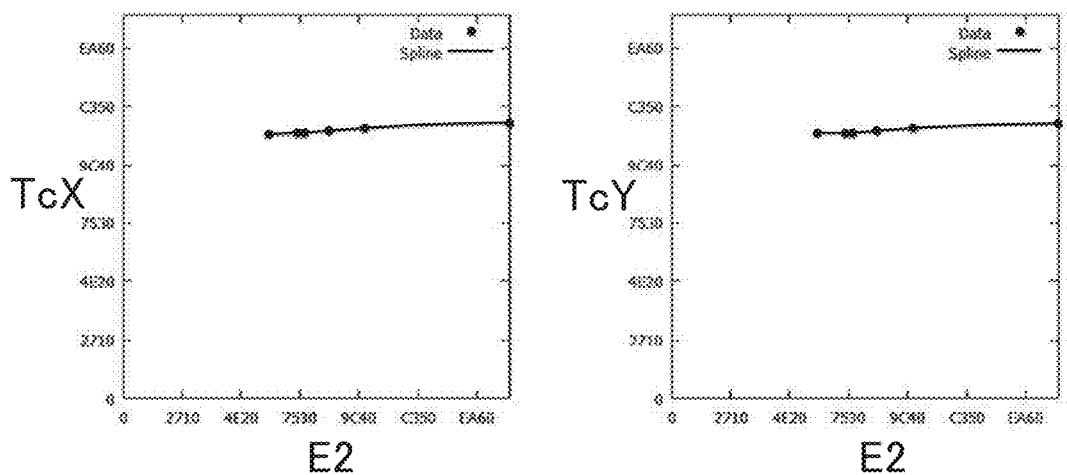
FIG. 18 illustrates graphs representing a relational expression between the excitation amount of the second illumination system lens and the tilt compensator.

FIG. 18 illustrates a graph of the relational expression between the excitation amount E2 of the second illumination system lens 22 and the tilt compensator X(TcX), and a graph of the relational expression between the excitation amount E2 of the second illumination system lens 22 and the tilt compensator Y(TcY).

The tilt compensator X(TcX) is an interlocking ratio of the first deflector 30 and the second deflector 32, to interlock the first deflector 30 and the second deflector 32, so that the illuminating position does not change when the illuminating angle of the electron beam in the X direction is controlled. The tilt compensator Y(TcY) is an interlocking ratio of the first deflector 30 and the second deflector 32, to interlock the first deflector 30 and the second deflector 32, so that the illuminating position does not change when the illuminating angle of the electron beam in the Y direction is controlled.

In the transmission electron microscope 100, the beam tilt is adjusted by interlocking the first deflector 30 to the second deflector 32 using the second deflector 32 as the reference. The tilt compensator X(TcX) and the tilt compensator Y(TcY) illustrated in FIG. 18 are ratios of the control amount of the first deflector 30 with respect to the control amount of the second deflector 32 which is operated as the reference. Therefore if the control amount of the second deflector 32, which is operated as the reference, is determined in the relational expression illustrated in FIG. 17, the control amount of the first deflector 30, which is interlocked to the second deflector 32, is determined using the relational expression illustrated in FIG. 18.

The relational expression between the excitation amount E2 and the tilt compensator X(TcX) and the relational expression between the excitation amount E2 and the tilt compensator Y (TcY) are expressed using the spline functions, for example. Here, the two relational expression illustrated in FIG. 18 are expressed by the spline functions, but the two relational expressions are not limited to the spline functions.

(4) Relational Expressions of Excitation Amount E2 and Shift Compensator

When the illuminating position of the electron beam is changed, the electron beam must be shifted so that the illuminating angle of the electron beam does not change. Therefore in the transmission electron microscope 100, the first deflector 30 and the second deflector 32 are interlocked. The interlocking ratio of the first deflector 30 and the second deflector 32 at this time is called a "shift compensator" (shift interlocking ratio).

Figure 19:
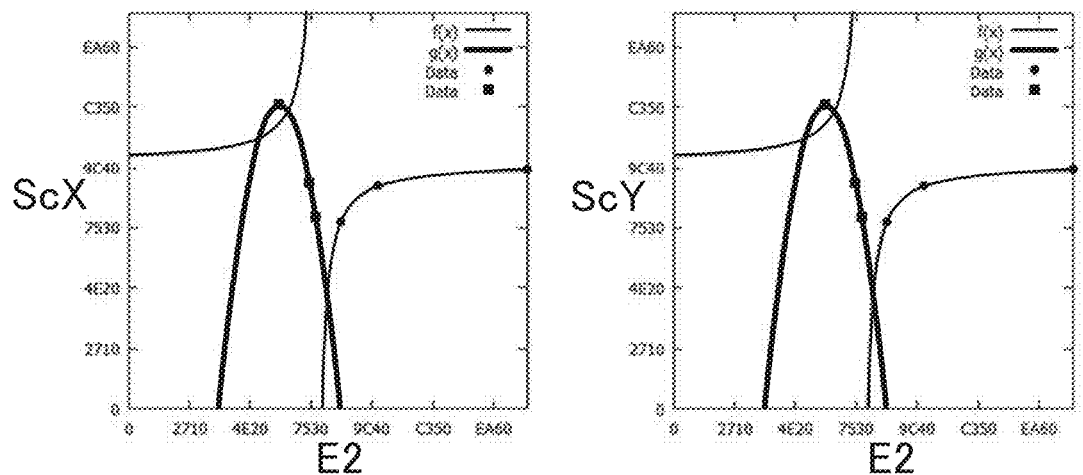
FIG. 19 illustrates graphs representing a relational expression between the excitation amount of the second illumination system lens and the shift compensator.

FIG. 19 illustrates a graph of the relational expression between the excitation amount E2 of the second illumination system lens 22 and the shift compensator X(ScX), and a graph of the relational expression between the excitation amount E2 of the second illumination system lens 22 and the shift compensator Y(ScY).

The shift compensator X(ScX) is an interlocking ratio of the first deflector 30 and the second deflector 32, to interlock the first deflector 30 and the second deflector 32, so that the illuminating angle does not change when the illuminating position of the electron beam in the X direction is controlled. The shift compensator Y(ScY) is an interlocking ratio of the first deflector 30 and the second deflector 32, to interlock the first deflector 30 and the second deflector 32, so that the illuminating angle does not change when the illuminating angle of the electron beam in the Y direction is controlled.

The relational expression between the excitation amount E2 and the shift compensator X(ScX) and the relational expression between the excitation amount E2 and the shift compensator Y (ScY) are expressed using two functions, for example. In the examples illustrated in FIG. 19, the relational expression between the excitation amount E2 and the shift compensator X(ScX) and the relational expression between the excitation amount E2 and the shift compensator Y(ScY) are expressed by an inverse proportional function (f(x)) and a convex-upward quadratic function (g(x)).

Figure 20:
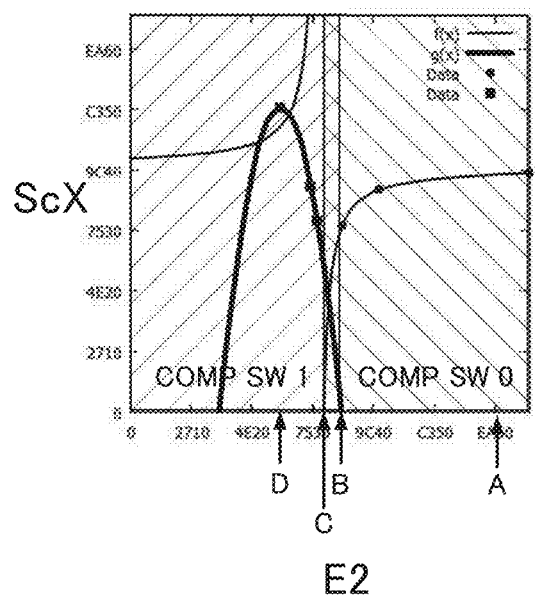
FIG. 20 illustrates a graph representing a relational expression between the excitation amount of the second illumination system lens and the shift compensator.

FIG. 20 is a diagram for explaining the relational expression between the excitation amount E2 and the shift compensator X(ScX).

As illustrated in FIG. 20, the relational expression between the excitation amount E2 and the shift compensator X(ScX) is constituted of the function f(x) and the function g(x). In order to determine the shift compensator (ScX) from the excitation amount E2, the function f(x) and the function g(x) are switched at the intersection of the functions.

Figure 21:
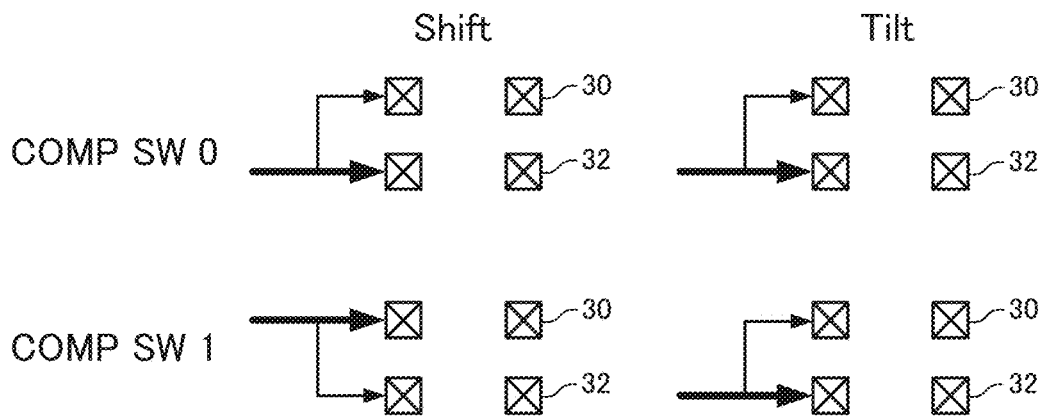
FIG. 21 is a diagram for explaining compensator switches.

The control unit 72 switches the functions and also switches the compensator switches. FIG. 21 is a diagram for explaining the compensator switches.

A compensator switch is a switch to select whether the first deflector 30 is used as the reference of an operation, or whether the second deflector 32 is used as the reference of an operation. As illustrated in FIG. 21, in the case of the compensator switch 0 (COMP SW0), the first deflector 30 is interlocked to the second deflector 32 using the second deflector 32 as the reference. In the case of the compensator switch 1 (COMP SW1), the second deflector 32 is interlocked to the first deflector 30 using the first deflector 30 as the reference of an operation.

For the control of the illuminating angle (Tilt) of the electron beam, in both the case of the compensator switch 0 and in the case of the compensator switch 1, the first deflector 30 is interlocked to the second deflector 32 using the second deflector 32 as the reference.

As illustrated in FIG. 20, the switching of the functions and the switching of the compensator switches are interlocked, and in the range of the function f(x), the compensator switch 0 is set, and in the range of the function g(x), the compensator switch 1 is set.

The function of the shift compensator X and the function of the shift compensator Y may be set independently. However, in the shift compensator X and the shift compensator Y, the timing to switch the respective compensator switch must be the same.

Figure 22:
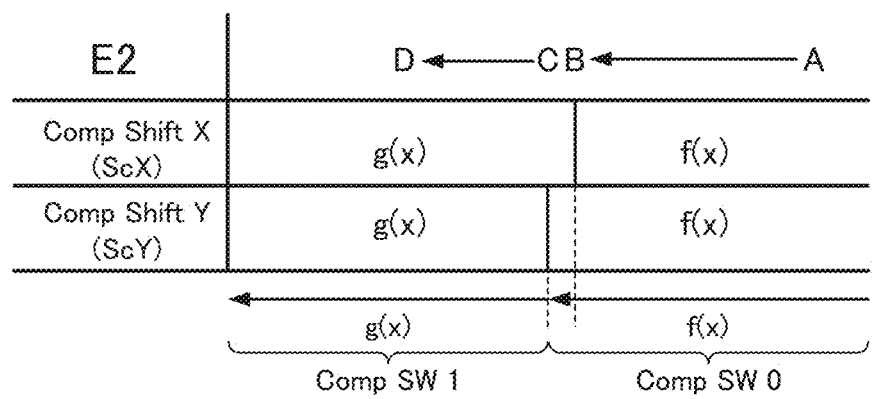
FIG. 22 is a diagram for explaining a timing of switching a function.
Figure 23:
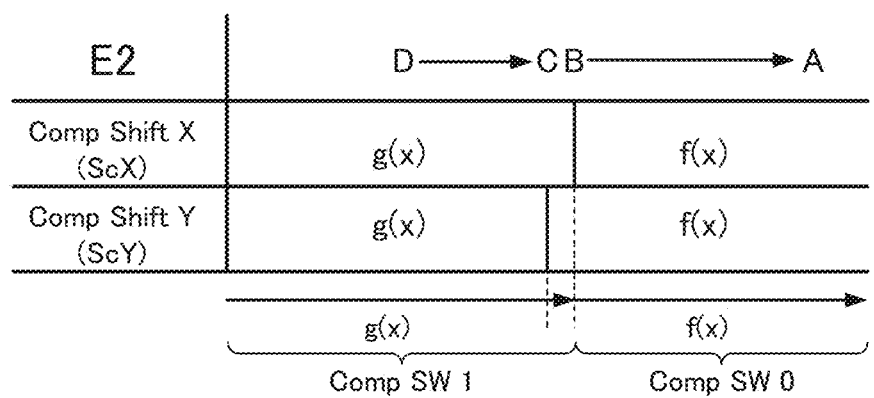
FIG. 23 is a diagram for explaining a timing of switching a function.

FIG. 22 and FIG. 23 are diagrams for explaining a timing of switching the functions.

As illustrated in FIG. 22 and FIG. 23, in a case where the intersection of the function f(x) and the function g(x) is different between the shift compensator X and the shift compensator Y, the functions and the compensator switch are switched simultaneously at a timing when both the shift compensator X and the shift compensator Y can switch the functions.

For example, as illustrated in FIG. 22, the excitation amount E2 is decreased from the excitation amount E2=A, and is changed in the sequence of the excitation amount E2=B, the excitation amount E2=C and the excitation amount E2=D.

In the case of the excitation amount E2=A, the function f(x) is used for both the shift compensator X and the shift compensator Y. In this case, the compensator switch is set to the compensator switch 0.

In the case of the excitation amount E2=B, the shift compensator X reaches a timing to switch to the function g(x), but the shift compensator Y remains as the function f(x). Therefore in the case of the excitation amount E2=B, the function f(x) is used for both the shift compensator X and the shift compensator Y, without switching the function.

In the case of the excitation amount E2=C, the shift compensator Y reaches a timing to switch to the function g(x). Therefore in the excitation amount E2=C, both the shift compensator X and the shift compensator Y switch the function f(x) to the function g(x). In this case, the compensator switch is also switched from the compensator switch 0 to the compensator switch 1.

In the case of the excitation amount E2=D, the function g(x) is used for both the shift compensator X and the shift compensator Y. In this case, the compensator switch is set to the compensator switch 1.

Further, for example, as illustrated in FIG. 23, the excitation amount E2 is increased from the excitation amount E2=D and is changed in the sequence of the excitation amount E2=C, the excitation amount E2=B and the excitation amount E2=A.

In the case of the excitation amount E2=D, the function g(x) is used for both the shift compensator X and the shift compensator Y. In this case, the compensator switch is set to the compensator switch 1.

In the case of the excitation amount E2=C, the shift compensator Y reaches a timing to switch the function f(x), but the shift compensator X remain as the function g(x). Therefore in the case of the excitation amount E2=C, the function g(x) is used for both the shift compensator X and the shift compensator Y, without switching the function.

In the case of the excitation amount E2=B, the shift compensator X reaches a timing to switch to the function f(x). Therefore in the excitation amount E2=B, both the shift compensator X and the shift compensator Y switch the function g(x) to the function f(x). In this case, the compensator switch is also switched from the compensator switch 1 to the compensator switch 0.

In the case of the excitation amount E2=A, the function f(x) is used for both the shift compensator X and the shift compensator Y. In this case, the compensator switch is set to the compensator switch 0.

4. Method of Adjusting Optical System

Figure 24:
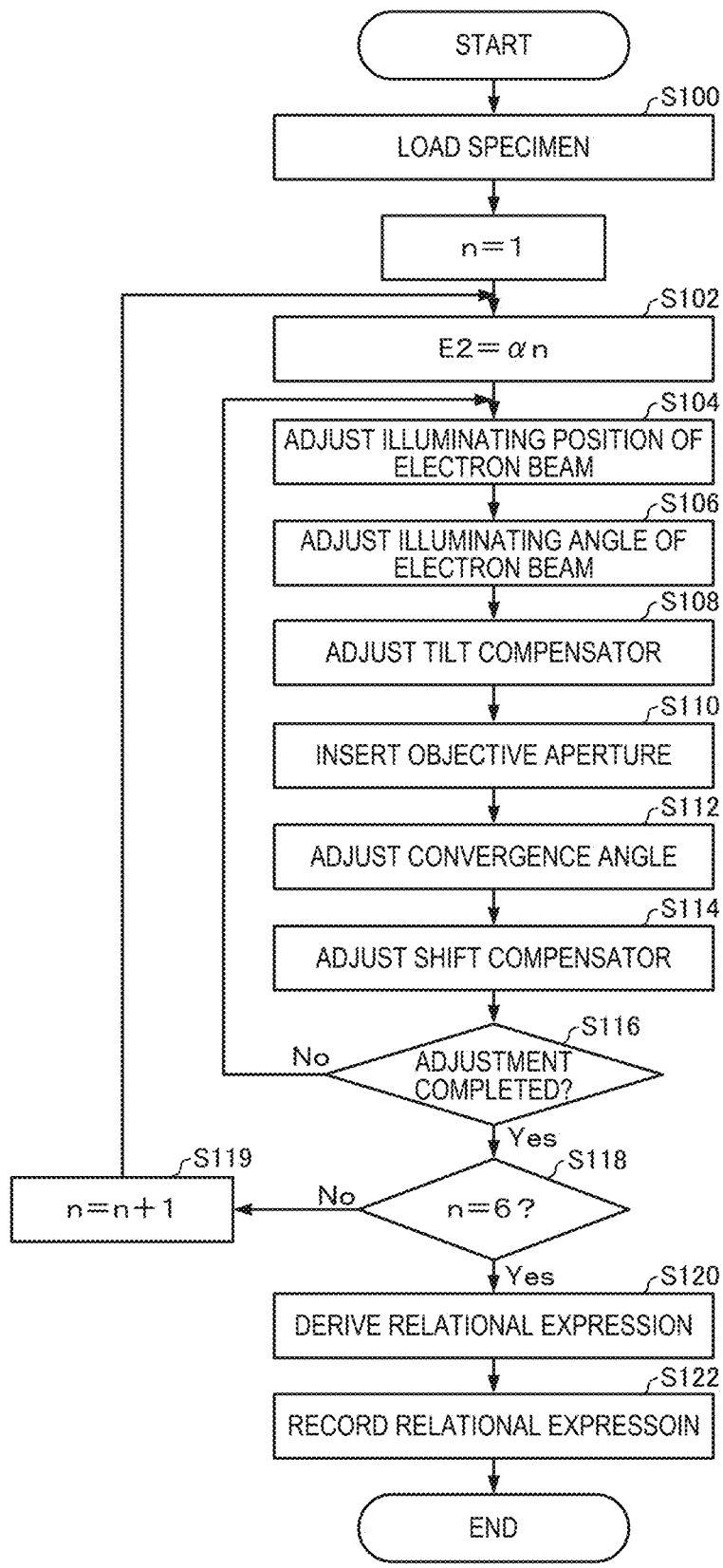
FIG. 24 is a flow chart illustrating an example of a method of adjusting an optical system.

FIG. 24 is a flow chart illustrating an example of the method of adjusting an optical system of the transmission electron microscope 100.

First a specimen 2 is loaded into the transmission electron microscope 100, and is set in an observable state (S100). Specifically, the specimen 2 is set in a specimen holder, the specimen holder is inserted into a specimen chamber, so that the specimen 2 is disposed in the specimen chamber. Then the electron beam is emitted to the specimen 2, whereby the specimen 2 is set in an observable state, and the observation field of view is determined. For example, the field of view is changed by operating the specimen stage to search for a desired field of view, and the observation field of view is determined. Then the control mode of the optical system in the control unit 72 is set to the adjustment mode. The adjustment mode is a mode to adjust the lenses constituting the optical system and the deflectors, and each lens and each deflector are not interlocked.

Then the excitation amount E2 of the second illumination system lens 22 is set (S102). In the transmission electron microscope 100, six preset values are set for the excitation amount E2 of the second illumination system lens 22. Here one of the six preset values is selected. For example, an excitation amount $\alpha 1$, an excitation amount $\alpha 2$, an excitation amount $\alpha 3$, an excitation amount $\alpha 4$, an excitation amount $\alpha 5$ and an excitation amount $\alpha 6$ are set as the preset values, and it is assumed that the excitation amount $\alpha 1$ (n=1) is selected here.

In the state of the excitation amount E2=$\alpha 1$, the illuminating position of the electron beam is adjusted using the first deflector 30 and the second deflector 32, and the control amount of the first deflector 30 and the control amount of the second deflector 32 are recorded as the first shift data (S104).

For example, the illuminating position of the electron beam is adjusted using the first deflector 30 and the second deflector 32, so that the illuminating position of the electron beam is positioned on the optical axis L. The first shift data includes information on the control amounts of the first deflector 30 and the second deflector 32 when the illuminating position in the X direction is adjusted, and information on the control amounts of the first deflector 30 and the second deflector 32 when the illuminating position in the Y direction is adjusted.

Then in the state of the excitation amount E2=$\alpha 1$, the illuminating angle of the electron beam is adjusted using the first deflector 30 and the second deflector 32, and the control amount of the first deflector 30 and the control amount of the second deflector 32 are recorded as the first tilt data (S106).

For example, the illuminating angle of the electron beam is adjusted by aligning the accelerating voltage center. The accelerating voltage center is aligned by aligning the center of the enlargement and shrinkage of an image, when fluctuations are added to the accelerating voltage, with the position of the optical axis L. The first tilt data includes information on the control amounts of the first deflector 30 and the second deflector 32 when the illuminating angle in the X direction is adjusted, and information on the control amounts of the first deflector 30 and the second deflector 32 when the illuminating angle in the Y direction is adjusted.

Then in the state of the excitation amount E2=$\alpha 1$, the tilt compensator is adjusted, and the control amount of the first deflector 30 and the control amount of the second deflector 32 are recorded as the first tilt interlocking ratio data (S108).

The tilt compensator is adjusted by adjusting the first deflector 30 and the second deflector 32, so that the illuminating position of the electron beam does not change, even if the illuminating angle of the electron beam is changed. The first tilt interlocking ratio data includes information on the interlocking ratio of the first deflector 30 and the second deflector 32 when the shift of the illuminating position, caused by changing the illuminating angle in the X direction, is corrected, and information on the interlocking ratio of the first deflector 30 and the second deflector 32 when the shift of the illuminating position, caused by changing the illuminating angle in the Y direction, is corrected.

Then the imaging system is set to the electron-diffraction mode, and the objective aperture 42 is inserted onto the optical axis L (S110). Then the imaging system is adjusted so that the objective aperture 42 is displayed on the display unit 82 or on the screen.

Then in the state of the excitation amount E2=$\alpha 1$, the first illumination system lens 20 is adjusted so that the electron-diffraction pattern is focused on, and the excitation amount of the first illumination system lens 20 is recorded as the first convergence angle data (S112).

For example, the first illumination system lens 20 is adjusted so that the diffraction point of the electron-diffraction pattern becomes a spot. In other words, the first illumination system lens 20 is adjusted so that the crossover of the electron beam is formed at the position of the objective aperture 42. Thus the convergence angle of the electron beam can be adjusted. The first convergence angle data includes information on the excitation amount of the first illumination system lens 20 when the electron-diffraction pattern is focused on.

Then in the state of the excitation amount E2=α1, the shift compensator is adjusted, and the control amount of the first deflector 30 and the control amount of the second deflector 32 are recorded as the first shift interlocking ratio data (S114).

The shift compensator is adjusted in the electron-diffraction mode. The shift compensator is adjusted such that the illuminating angle of the electron beam does not change, even if the illuminating position of the electron beam is changed. The first shift interlocking ratio data includes information on the interlocking ratio of the first deflector 30 and the second deflector 32 when the shift of the illuminating angle, caused by changing the illuminating position in the X direction, is corrected, and information on the interlocking ratio of the first deflector 30 and the second deflector 32 when the shift of the illuminating angle, caused by changing the illuminating position in the Y direction, is corrected.

Step S104, step S106, step S108, step S110, step S112 and step S114 are repeated until the adjustments of the illuminating position of the electron beam, the illuminating area of the electron beam, the convergence angle of the electron beam, the tilt compensator and the shift compensator are completed.

When these adjustments are completed (Yes in S116), it is determined whether n is n=6 (S118). In other words, it is determined whether processing is performed with all the preset values of the excitation amount E2. If it is determined that n is not n=6 (No in S118), the excitation amount E2 is set to α2 (n=2), (S119), and the excitation amount E2 of the second illumination system lens 22 is set to the excitation amount E2=α2 (S102).

In the state of the excitation amount E2=α2, the illuminating position of the electron beam is adjusted using the first deflector 30 and the second deflector 32, and the control amount of the first deflector 30 and the control amount of the second deflector 32 are recorded as the second shift data (S104).

Then in the state of the excitation amount E2=α2, the illuminating angle of the electron beam is adjusted using the first deflector 30 and the second deflector 32, and the control amount of the first deflector 30 and the control amount of the second deflector 32 are recorded as the second tilt data (S106).

Then in the state of the excitation amount E2=α2, the tilt compensator is adjusted, and the control amount of the first deflector 30 and the control amount of the second deflector 32 are recorded as the second tilt interlocking ratio data (S108).

Then the imaging system is set to the electron-diffraction mode, and the objective aperture 42 is inserted onto the optical axis L (S110). Then the imaging system is adjusted so that the objective aperture 42 is focused on.

Then in the state of the excitation amount E2=α2, the first illumination system lens 20 is adjusted so that the electron-diffraction pattern is focused on, and the excitation amount of the first illumination system lens 20 is recorded as the second convergence angle data (S112).

Then in the state of the excitation amount E2=α1, the shift compensator is adjusted, and the control amount of the first deflector 30 and the control amount of the second deflector 32 are recorded as the second shift interlocking ratio data (S114).

Step S104, step S106, step S108, step S110, step S112 and step S114 are repeated until the adjustments of the illuminating position of the electron beam, the illuminating angle of the electron beam, the convergence angle of the electron beam, the tilt compensator and the shift compensator are completed.

When these adjustments are completed (Yes in S116), it is determined that the excitation amount E2 is set to α3 (n=3) (S119), and the excitation amount E2 of the second illumination system lens 22 is set to the excitation amount E2=α3 (S102).

In this way, the processing steps S102 to S119 are executed in the state of the excitation amount E2=α3, the state of the excitation amount E2=α4, the state of the excitation amount E2=α5 and the state of the excitation amount E2=α6 in the same manner.

In a case where n=6 is determined in step S118 (Yes in S118), that is, in a case where it is determined that processing was performed with all the preset values of the excitation amount E2, the relational expression between the excitation amount E1 and the excitation amount E2, the relational expression between the excitation amount E2 and the beam shift X, the relational expression between the excitation amount E2 and the beam shift Y, the relational expression between the excitation amount E2 and the beam tilt X, the relational expression between the excitation amount E2 and the beam tilt Y, the relational expression between the excitation amount E2 and the tilt compensator X, the relational expression between the excitation amount E2 and the tilt compensator Y, the relational expression between the excitation amount E2 and the shift compensator X, and the relational expression between the excitation amount E2 and the shift compensator Y are derived (S120).

The relational expression between the excitation amount E1 and the excitation amount E2 can be derived based on the first convergence angle data acquired with the excitation amount E2=α1, the second convergence angle data acquired with excitation amount E2=α2, the third convergence angle data acquired with the excitation amount E2=α3, the fourth convergence angle data acquired with the excitation amount E2=α4, the fifth convergence angle data acquired with the excitation amount E2=α5, and the sixth convergence angle data acquired with the excitation amount E2=α6.

For example, as illustrated in FIG. 13, the first to sixth convergence angle data are plotted and fitted with the inverse-proportional function (y=a/(x−b)+c). Thereby the relational expression between the excitation amount E1 and the excitation amount E2 can be derived.

The relational expression between the excitation amount E2 and the beam shift X can be derived based on the first shift data acquired with the excitation amount E2=α1, the second shift data acquired with the excitation amount E2=α2, the third shift data acquired with the excitation amount E2=α3, the fourth shift data acquired with the excitation amount E2=α4, the fifth shift data acquired with the excitation amount E2=α5, and the sixth shift data acquired with the excitation amount E2=α6.

For example, as indicted in FIG. 15, the first to sixth shift data are lotted and fitted with the spline function. Thereby the relational expression between the excitation amount E2 and the beam shift X can be derived.

The relational expression between the excitation amount E2 and the beam shift Y, illustrated in FIG. 15, can also be derived in the same manner.

The relational expression between the excitation amount E2 and the beam tilt X can be derived based on the first tilt data acquired with the excitation amount E2=α1, the second tilt data acquired with the excitation amount E2=α2, the third tilt data acquired with the excitation amount E2=α3, the fourth tilt data acquired with the excitation amount E2=α4, the fifth tilt data acquired with the excitation amount E2=α5, and the sixth tilt data acquired with the excitation amount E2=α6.

For example, as indicted in FIG. 17, the first to sixth tilt data are plotted and fitted with the spline function. Thereby the relational expression between the excitation amount E2 and the beam tilt X(TX) can be derived.

The relational expression between the excitation amount E2 and the beam tilt Y(TY), illustrated in FIG. 17, can also be derived in the same manner.

The relational expression between the excitation amount E2 and the tilt compensator X can be derived based on the first tilt interlocking ratio data acquired with the excitation amount E2=α1, the second tilt interlocking ratio data acquired with the excitation amount E2=α2, the third tilt interlocking ratio data acquired with the excitation amount E2=α3, the fourth tilt interlocking ratio data acquired with the excitation amount E2=α4, the fifth tilt interlocking ratio data acquired with the excitation amount E2=α5, and the sixth tilt interlocking ratio data acquired with the excitation amount E2=α6.

For example, as illustrated in FIG. 18, the first to sixth tilt interlocking ratio data are plotted and fitted with the spline function. Thereby the relational expression between the excitation amount E2 and the tilt compensator X(TcX) can be derived.

The relational expression between the excitation amount E2 and the tilt compensator Y(TcY), illustrated in FIG. 18, can also be derived in the same manner.

The relational expression between the excitation amount E2 and the shift compensator X is derived based on the first shift interlocking ratio data acquired with the excitation amount E2=al, the second shift interlocking ratio data acquired with the excitation amount E2=α2, the third shift interlocking ratio data acquired with the excitation amount E2=α3, the fourth shift interlocking ratio data acquired with the excitation amount E2=α4, the fifth shift interlocking ratio data acquired with the excitation amount E2=α5, and the sixth shift interlocking ratio data acquired with the excitation amount E2=α6.

For example, as illustrated in FIG. 19, the first to sixth shift interlocking ratio data are plotted, and a range where the excitation amount E2 is large is fitted with the inverse-proportional function ($y=a/(x-b)+c$), and a range where the excitation amount E2 is small is fitted with a convex-upward quadratic function ($y=ax^2+bx)+c$). Thereby the relational expression between the excitation amount E2 and the shift compensator X(ScX) can be derived.

The relational expression between the excitation amount E2 and the shift compensator Y(ScY), illustrated in FIG. 19, can also be derived in the same manner.

The nine relational expressions derived like this are stored in the storage unit 84 (S122). Then the control mode of the optical system in the control unit 72 is switched from the adjustment mode to the interlocking mode. In the interlocking mode, the processing unit 70 perform processing in accordance with the above mentioned flow chart in FIG. 12. Thereby even if the illuminating area of the electron beam is changed, the convergence angle of the electron beam, the illuminating position of the electron beam and the illuminating angle of the electron beam are maintained to be constant.

The optical system can be adjusted by the above steps.

5. Functional Effects

The transmission electron microscope 100 includes: a first illumination system lens 20 that changes an illuminating area of an electron beam; a second illumination system lens 22 that is disposed in a subsequent stage of the first illumination system lens 20; a first deflector 30 and a second deflector 32 that are disposed between the first illumination system lens 20 and the second illumination system lens 22; and a control unit 72 that controls the first illumination system lens 20, the second illumination system lens 22, the first deflector 30 and the second deflector 32. The control unit 72 performs the processing to determine the excitation amount of the second illumination system lens 22 for the second illumination system lens 22 to satisfy the first optical condition, based on the excitation amount of the first illumination system lens 20, and the processing to determine the control amount of the first deflector 30 and the control amount of the second deflector 32 for the first deflector 30 and the second deflector 32 to satisfy the second optical condition, based on the excitation amount of the second illumination system lens 22. Here, the first optical condition is an optical condition for the convergence angle of the electron beam to be constant, even if the excitation amount of the first illumination system lens 20 changes, and the second optical condition is an optical condition for the illuminating position of the electron beam and the illuminating angle of the electron beam to be constant, even if the excitation amount of the first illumination system lens 20 changes.

Therefore in the transmission electron microscope 100, the convergence angle of the electron beam, the illuminating position of the electron beam and the illuminating angle of the electron beam can be maintained to be constant, even if the illuminating area of the electron beam is changed. Hence in the transmission electron microscope 100, the state of selecting the transmitted wave or the diffractive wave using the objective aperture 42 can be maintained, even if the illuminating area of the electron beam is changed, for example.

For example, in a case where the convergence angle or the like of the electron beam changes if the illuminating area of the electron beam is changed, a good bright-field image or a good dark-field image cannot be acquired, as illustrated in FIG. 7. In the transmission electron microscope 100, on the other hand, the convergence angle or the like of the electron beam can be maintained to be constant, even if the illuminating area of the electron beam is changed, hence a good bright-field image or a good dark-field image can be acquired, even if the illuminating area of the electron beam is changed.

Further, in the transmission electron microscope 100, the convergence angle of the electron beam, the illuminating position of the electron beam and the illuminating angle of the electron beam can be maintained to be constant, even if the illuminating area of the electron beam is changed, hence the illuminating area of the electron beam can be changed in a state of inserting the objective aperture 42.

For example, in a case where a specimen constituted of a light element, such as biological specimen, high contrast cannot be acquired if the objective aperture 42 is not inserted. However, in a case where the convergence angle or the like of the electron beam changes if the illuminating area of the electron beam is changed, the image cannot be acquired if the illuminating area of the electron beam is changed in the state of inserting the objective aperture 42. In the transmission electron microscope 100, on the other hand, the convergence angle or the like of the electron beam can be maintained to be constant, even if the illuminating area of the electron beam is changed, hence the illuminating area of the electron beam can be changed in the state of inserting the objective aperture 42. As a consequence, the biological specimen or the like can be continuously observed while maintaining the high contrast state.

The transmission electron microscope 100 includes the display control unit 74 that displays the information about the illuminating area of the electron beam depending on the excitation amount of the first illumination system lens 20, on the display unit 82. Hence in the transmission electron microscope 100, the user can easily recognize the illuminating area of the electron beam.

The method of adjusting the optical system according to the transmission electron microscope 100 includes: setting the excitation amount of the second illumination system lens 22 to the first excitation amount (excitation amount B2=α1); adjusting the illuminating position of the electron beam by using the first deflector 30 and the second deflector 32 in the first state in which the excitation amount of the second illumination system lens 22 is the first excitation amount, and recording the control amount of the first deflector 30 and the control amount of the second deflector 32, as the first shift data; adjusting the illuminating angle of the electron beam by using the first deflector 30 and the second deflector 32 in the first state, and recording the control amount of the first deflector 30 and the control amount of the second deflector 32, as the first tilt data; and adjusting the convergence angle of the electron beam by using the first illumination system lens 20 in the first state, and recording the excitation amount of the first illumination system lens 20, as the first convergence angle data.

Further, the method of adjusting an optical system includes: setting the excitation amount of the second illumination system lens 22 to the second excitation amount (excitation amount B2=α2) which is different from the first excitation amount; adjusting the illuminating position of the electron beam by using the first deflector 30 and the second deflector 32 in the second state in which the excitation amount of the second illumination system lens 22 is the second excitation amount, and recording the control amount of the first deflector 30 and the control amount of the second deflector 32, as the second shift data; adjusting the illuminating angle of the electron beam by using the first deflector 30 and the second deflector 32 in the second state, and recording the control amount of the first deflector 30 and the control amount of the second deflector 32, as the second tilt data; and adjusting the convergence angle of the electron beam by using the first illumination system lens 20 in the second state, and recording the excitation amount of the first illumination system lens 20, as the second convergence angle data.

Furthermore, the method of adjusting an optical system includes: deriving the relational expression between the excitation amount of the second illumination system lens 22 and the control amount of the first deflector 30 or the second deflector 32 based on the first shift data and the second shift data, the derived relation expression enabling the illuminating position of the electron beam to be constant even if the excitation amount of the first illumination system lens 20 has changed; deriving the relational expression between the excitation amount of the second illumination system lens 22 and the control amount of the first deflector 30 or the control amount of the second deflector 32 based on the first tilt data and the second tilt data, the derived relational expression enabling the illuminating angle of the electron beam to be constant even if the excitation amount of the first illumination system lens 20 has changed; and deriving a relational expression between the excitation amount of the second illumination system lens 22 and the excitation amount of the first illumination system lens 20 based on the first convergence angle data and the second convergence angle data, the derived relational expression enabling the convergence angle of the electron beam to be constant even if the excitation amount of the first illumination system lens 20 has changed.

Therefore, the method of adjusting an optical system in the transmission electron microscope 100 can derive the relational expression between the excitation amount of the first illumination system lens 20 and the excitation amount of the second illumination system lens 22, and the relational expression between the excitation amount of the second illumination system lens 22 and the control amounts of the first deflector 30 and the second deflector 32, the derived relational expressions enable the convergence angle of the electron beam, the illuminating position of the electron beam and the illuminating angle of the electron to be constant even if the illuminating area of the electron beam has been changed.

The method of adjusting an optical system in the transmission electron microscope 100 may further include: correcting a shift of the illuminating position of the electron beam caused by changing the illuminating angle of the electron beam, by interlocking the first deflector 30 and the second deflector 32 in the first state, and recording the interlocking ratio of the first deflector 30 and the second deflector 32 as the first tilt interlocking ratio data; and correcting a shift of the illuminating angle of the electron beam caused by changing the illuminating position of the electron beam, by interlocking the first deflector 30 and the second deflector 32 in the first state, and recording the interlocking ratio of the first deflector 30 and the second deflector 32 as the first shift interlocking ratio data.

The method of adjusting an optical system may further includes: correcting a shift of the illuminating position of the electron beam caused by changing the illuminating angle of the electron beam, by interlocking the first deflector 30 and the second deflector 32 in the second state and recording the interlocking ratio of the first deflector 30 and the second deflector 32 as the second tilt interlocking ratio data; and correcting a shift of the illuminating angle of the electron beam caused by changing the illuminating position of the electron beam, by interlocking the first deflector 30 and the second deflector 32 in the second state and recording the interlocking ratio of the first deflector 30 and the second deflector 32 as the second shift interlocking ratio data.

The method of adjusting an optical system may further includes: deriving the relational expression between the excitation amount of the second illumination system lens 22 and the interlocking ratio of the first deflector 30 and the second deflector 32 based on the first tilt interlocking ratio data and the second tilt interlocking ratio data, the derived relational expression enabling to correct the shift of the illuminating position of the electron beam caused by changing the illuminating angle of the electron beam; and deriving the relational expression between the excitation amount of the second illumination system lens 22 and the interlocking ratio of the first deflector 30 and the second deflector 32 based on the first shift interlocking ratio data and the second shift interlocking ratio data, the derived relational expression enabling to correct the shift of the illuminating angle of the electron beam caused by changing the illuminating position of the electron beam.

Therefore the method of adjusting an optical system in the transmission electron microscope 100 can derive the relational expression between the excitation amount of the second illumination system lens 22 and the interlocking ratio of the first deflector 30 and the second deflector 32, the derived relational expression enabling to correct the shift of the illuminating position caused by changing the illuminating angle of the electron beam, and also derive the relational expression between the excitation amount of the second illumination system lens 22 and the interlocking ratio of the first deflector 30 and the second deflector 32, the derived relational expression enabling to correct the shift of the illuminating angle caused by changing the illuminating position of the electron beam.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A transmission electron microscope comprising:
   a first illumination system lens for changing an illuminating area of an electron beam;
   a second illumination system lens that is disposed in a subsequent stage of the first illumination system lens;
   a first deflector and a second deflector that are disposed between the first illumination system lens and the second illumination system lens;
   an objective lens that is disposed in a subsequent stage of the second illumination system lens; and
   a control unit configured to control the first illumination system lens, the second illumination system lens, the first deflector and the second deflector,
   the control unit performing processing of:
   determining an excitation amount of the second illumination system lens based on an excitation amount of the first illumination system lens, the determined excitation amount enabling the second illumination system lens to satisfy a first optical condition; and
   determining a control amount of the first deflector and a control amount of the second deflector based on the determined excitation amount of the second illumination system lens, the determined control amounts enabling the first deflector and the second deflector to satisfy a second optical condition,
   the first optical condition is an optical condition for a convergence angle of the electron beam to be constant even if the excitation amount of the first illumination system lens has changed, and
   the second optical condition is an optical condition for an illuminating position of the electron beam and an illuminating angle of the electron beam to be constant even if the excitation amount of the first illumination system lens has changed.

2. The transmission electron microscope according to claim 1, wherein
   in processing of determining the excitation amount of the second illumination system lens, the excitation amount of the second illumination system lens is determined from the excitation amount of the first illumination system lens by using a relational expression between the excitation amount of the first illumination system lens and the excitation amount of the second illumination system lens.

3. The transmission electron microscope according to claim 1, wherein
   in processing of determining control amounts of the first deflector and the second deflector, the control amounts of the first deflector and the second deflector are determined from the excitation amount of the second illumination system lens by using a relational expression between the excitation amount of the second illumination system lens and the control amounts of the first deflector and the second deflector.

4. The transmission electron microscope according to claim 1, further comprising
   a display control unit that displays, on a display unit, information on the illuminating area of the electron beam depending on the excitation amount of the first illumination system lens.

5. A method of adjusting an optical system in a transmission electron microscope comprising a first illumination system lens for changing an illuminating area of an electron beam, a second illumination system lens that is disposed in a subsequent stage of the first illumination system lens, a first deflector and a second deflector that are disposed between the first illumination system lens and the second illumination system lens, and an objective lens that is disposed in a subsequent stage of the second illumination system lens,
   the method comprising:
   setting an excitation amount of the second illumination system lens to a first excitation amount;
   adjusting an illuminating position of the electron beam by using the first deflector and the second deflector in a first state in which the excitation amount of the second illumination system lens is the first excitation amount, and recording a control amount of the first deflector and a control amount of the second deflector, as first shift data;
   adjusting an illuminating angle of the electron beam by using the first deflector and the second deflector in the first state, and recording the control amount of the first deflector and the control amount of the second deflector, as first tilt data;
   adjusting a convergence angle of the electron beam by using the first illumination system lens in the first state, and recording the excitation amount of the first illumination system lens, as first convergence angle data;

setting the excitation amount of the second illumination system lens to a second excitation amount which is different from the first excitation amount;

adjusting an illuminating position of the electron beam by using the first deflector and the second deflector in a second state in which the excitation amount of the second illumination system lens is the second excitation amount, and recording the control amount of the first deflector and the control amount of the second deflector, as second shift data;

adjusting an illuminating angle of the electron beam by using the first deflector and the second deflector in the second state, and recording the control amount of the first deflector and the control amount of the second deflector, as second tilt data;

adjusting a convergence angle of the electron beam by using the first illumination system lens in the second state, and recording the excitation amount of the first illumination system lens, as second convergence angle data;

deriving a relational expression between the excitation amount of the second illumination system lens and the control amount of the first deflector or the control amount of the second deflector based on the first shift data and the second shift data, the derived relational expression enabling the illuminating position of the electron beam to be constant even if the excitation amount of the first illumination system lens has changed;

deriving a relational expression between the excitation amount of the second illumination system lens and the control amount of the first deflector or the control amount of the second deflector based on the first tilt data and the second tilt data, the derived relational expression enabling the illuminating angle of the electron beam to be constant even if the excitation amount of the first illumination system lens has changed; and deriving a relational expression between the excitation amount of the second illumination system lens and the excitation amount of the first illumination system lens based on the first convergence angle data and the second convergence angle data, the derived relational expression enabling the convergence angle of the electron beam to be constant even if the excitation amount of the first illumination system lens has changed.

6. The method of adjusting an optical system according to claim 5, further comprising:

correcting a shift of the illuminating position of the electron beam caused by changing the illuminating angle of the electron beam, by interlocking the first deflector and the second deflector in the first state, and recording an interlocking ratio of the first deflector and the second deflector as first tilt interlocking ratio data;

correcting a shift of the illuminating angle of the electron beam caused by changing the illuminating position of the electron beam, by interlocking the first deflector and the second deflector in the first state, and recording the interlocking ratio of the first deflector and the second deflector as first shift interlocking ratio data;

correcting the shift of the illuminating position of the electron beam caused by changing the illuminating angle of the electron beam, by interlocking the first deflector and the second deflector in the second state, and recording the interlocking ratio of the first deflector and the second deflector as second tilt interlocking ratio data;

correcting the shift of the illuminating angle of the electron beam caused by changing the illuminating position of the electron beam, by interlocking the first deflector and the second deflector in the second state, and recording the interlocking ratio of the first deflector and the second deflector as second shift interlocking ratio data;

deriving a relational expression between the excitation amount of the second illumination system lens and the interlocking ratio of the first deflector and the second deflector based on the first tilt interlocking ratio data and the second tilt interlocking ratio data, the derived relational expression enabling to correct the shift of the illuminating position of the electron beam caused by changing the illuminating angle of the electron beam; and deriving a relational expression between the excitation amount of the second illumination system lens and the interlocking ratio of the first deflector and the second deflector based on the first shift interlocking ratio data and the second shift interlocking ratio data, the derived relational expression enabling to correct the shift of the illuminating angle of the electron beam caused by changing the illuminating position of the electron beam.

\* \* \* \* \*